(12) United States Patent
Jin et al.

(10) Patent No.: US 11,955,570 B2
(45) Date of Patent: *Apr. 9, 2024

(54) SOLAR CELL AND METHOD FOR PRODUCING SAME

(71) Applicants: Jinko Green Energy (Shanghai) Management Co., LTD., Shanghai (CN); ZHEJIANG JINKO SOLAR CO., LTD., Zhejiang (CN)

(72) Inventors: Jingsheng Jin, Shanghai (CN); Xinyu Zhang, Shanghai (CN)

(73) Assignees: Jinko Green Energy (Shanghai) Management Co., LTD., Shanghai (CN); Zhejiang Jinko Solar Co., Ltd., Haining (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/878,914

(22) Filed: Aug. 2, 2022

(65) Prior Publication Data

US 2022/0376122 A1 Nov. 24, 2022

Related U.S. Application Data

(63) Continuation of application No. 17/133,560, filed on Dec. 23, 2020, now Pat. No. 11,450,775.

(30) Foreign Application Priority Data

Nov. 19, 2020 (CN) .......................... 202011307502.0

(51) Int. Cl.
*H01L 31/0216* (2014.01)
*H01L 31/0224* (2006.01)
(Continued)

(52) U.S. Cl.
CPC .. *H01L 31/02167* (2013.01); *H01L 31/02168* (2013.01); *H01L 31/022441* (2013.01);
(Continued)

(58) Field of Classification Search
CPC ......... H01L 31/02167; H01L 31/02168; H01L 31/022441; H01L 31/02363; H01L 31/0682; H01L 31/1868
See application file for complete search history.

(56) References Cited

U.S. PATENT DOCUMENTS

2007/0169808 A1 7/2007 Kherani et al.
2012/0186649 A1 7/2012 Turner et al.
(Continued)

FOREIGN PATENT DOCUMENTS

CN 105702759 A 6/2016
CN 105789345 A 7/2016
(Continued)

OTHER PUBLICATIONS

Jinko Green Energy (Shanghai) Management Co., LTD. et al., Extended European Search Report, EP 22188010.7, dated Oct. 31, 2022, 8 pgs.
(Continued)

*Primary Examiner* — Tamir Ayad
(74) *Attorney, Agent, or Firm* — USCH Law, PC

(57) ABSTRACT

The present disclosure provides a solar cell and a method for producing same. The solar cell includes: a substrate; a first passivation film, an anti-reflection layer and at least one first electrode formed on a front surface of the substrate; and a tunneling layer, a field passivation layer and at least one second electrode formed on a rear surface. The field passivation layer includes a first field passivation sub-layer and a second field passivation sub-layer; a conductivity of the first field passivation sub-layer is greater than a conductivity of
(Continued)

the second field passivation sub-layer, and a thickness of the second field passivation sub-layer is smaller than a thickness of the first field passivation sub-layer; either the at least one first electrode or the at least one second electrode includes a silver electrode, a conductive adhesive and an electrode film that are sequentially formed in a direction away from the substrate.

9 Claims, 5 Drawing Sheets

(51) Int. Cl.
  *H01L 31/0236* (2006.01)
  *H01L 31/068* (2012.01)
  *H01L 31/18* (2006.01)
(52) U.S. Cl.
  CPC .... *H01L 31/02363* (2013.01); *H01L 31/0682* (2013.01); *H01L 31/1868* (2013.01)

(56) References Cited

U.S. PATENT DOCUMENTS

| | | | |
|---|---|---|---|
| 2014/0311567 | A1 | 10/2014 | Choi et al. |
| 2016/0020342 | A1 | 1/2016 | Heng et al. |
| 2016/0027951 | A1 | 1/2016 | Shim et al. |
| 2016/0126394 | A1 | 5/2016 | Romijn et al. |
| 2018/0083149 | A1 | 3/2018 | Kim et al. |
| 2018/0138337 | A1 | 5/2018 | Tamboli et al. |
| 2019/0131472 | A1 | 5/2019 | Hsiao et al. |

FOREIGN PATENT DOCUMENTS

| | | |
|---|---|---|
| CN | 206225372 U | 6/2017 |
| CN | 105762202 B | 8/2017 |
| CN | 109494261 A | 3/2019 |
| CN | 106449800 B | 4/2019 |
| CN | 110265494 A | 9/2019 |
| CN | 110571299 A | 12/2019 |
| CN | 110838528 A | 2/2020 |
| CN | 210897294 U | 6/2020 |
| CN | 111628050 A | 9/2020 |
| EP | 2096682 A1 | 9/2009 |
| EP | 2749620 A1 | 7/2014 |
| EP | 3026713 A1 | 6/2016 |
| JP | 2010161178 A | 7/2010 |
| JP | 5019397 B2 | 9/2012 |
| JP | 2015122435 A | 7/2015 |
| KR | 20160063861 A | 6/2016 |
| KR | 102132740 B1 | 7/2020 |
| WO | 2019021545 A1 | 1/2019 |

OTHER PUBLICATIONS

Jinko Green Energy (Shanghai) Management Co., LTD. et al., AU First Office Action, AU 2020294222, dated Dec. 17, 2021, 8pgs.

Jinko Green Energy (Shanghai) Management Co., LTD. et al., AU Notice of Acceptance, AU 2020294222, dated Feb. 23, 2022, 4pgs.

Jinko Green Energy (Shanghai) Management Co., LTD. et al., JP First Office Action with English translation, JP 2020-212129, dated May 14, 2021, 6pgs.

Jinko Green Energy (Shanghai) Management Co., LTD. et al., JP Second Office Action with English translation, JP 2020-212129, dated Sep. 2, 2021, 4pgs.

Jinko Green Energy (Shanghai) Management Co., LTD. et al., JP Decision to Grant with English translation, JP 2020-212129, dated Oct. 27, 2021, 5pgs.

Jinko Green Energy (Shanghai) Management Co., LTD. et al., Extended European Search Report, EP 20216350.7, dated Jun. 14, 2021, 8pgs.

Jinko Green Energy (Shanghai) Management Co., LTD. et al., EP Intention to Grant, EP 20216350.7, dated Jul. 15, 2022, 38pgs.

Jinko Green Energy (Shanghai) Management Co., LTD. et al., US Non-Final Rejection, U.S. Appl. No. 17/133,560, dated Dec. 23, 2021, 16pgs.

Jinko Green Energy (Shanghai) Management Co., LTD. et al., US Final Rejection, U.S. Appl. No. 17/133,560, dated May 19, 2022, 13pgs.

Jinko Green Energy (Shanghai) Management Co., LTD. et al., US Notice of Allowance, U.S. Appl. No. 17/133,560, dated Jul. 8, 2022, 8pgs.

SOLAR CELL AND METHOD FOR PRODUCING SAME

CROSS-REFERENCE TO RELATED APPLICATION

The present application is a continuation of U.S. patent application Ser. No. 17/133,560, filed on Dec. 23, 2020, which claims the benefit of priority under the Paris Convention to Chinese Patent Application No. 202011307502.0 filed on Nov. 19, 2020, each of which is incorporated herein by reference in its entirety.

TECHNICAL FIELD

Embodiments of the present disclosure relate to the photovoltaic field, in particular to a solar cell and a method for producing the solar cell.

BACKGROUND

With the continuous development of solar cell technology, a recombination loss in a metal contact area has become one of important factors restricting further improvement of conversion efficiency of a solar cell. In order to improve the conversion efficiency of the solar cell, the solar cell is usually designed by a passivated contact structure in order to reduce bulk recombination and surface recombination of the solar cell. In addition, in order to reduce resistivity of the solar cell, silver is usually used as an electrode material in the existing technology. The silver may cause expensive manufacturing costs.

For photovoltaic enterprises, higher conversion efficiency of the solar cell and lower manufacturing costs is still pursued. Therefore, it is desirable to improve the conversion efficiency and reduce the manufacturing costs by developing a novel solar cell.

SUMMARY

Some embodiments of the present disclosure are intended to provide a solar cell with improved conversion efficiency and reduced cost and a method for producing the solar cell.

Some embodiments provide a solar cell, including: a substrate; a first passivation film, an anti-reflection layer and at least one first electrode sequentially formed on a front surface of the substrate; and a tunneling layer, a field passivation layer and at least one second electrode sequentially formed on a rear surface of the substrate. The field passivation layer includes a first field passivation sub-layer corresponding to a portion of the field passivation layer in a first region between the at least one second electrode and the substrate and a second field passivation sub-layer corresponding to a portion of the field passivation layer in a second region between adjacent second electrodes; a conductivity of the first field passivation sub-layer is greater than a conductivity of the second field passivation sub-layer, and a thickness of the second field passivation sub-layer is smaller than a thickness of the first field passivation sub-layer; the at least one first electrode or the at least one second electrode serves as a hybrid electrode including a silver electrode, a conductive adhesive and an electrode film that are sequentially formed in a direction away from the substrate.

In some embodiments, a bottom surface of the second field passivation sub-layer is flush with a bottom surface of the first field passivation sub-layer in the direction away from the substrate toward the field passivation layer.

In some embodiments, a surface doping concentration of a top surface of the second field passivation layer is lower than a surface doping concentration of a top surface of the first field passivation layer in the direction of the substrate toward the field passivation layer.

In some embodiments, a top surface doping concentration of the first field passivation sub-layer is different from a top surface doping concentration of the second field passivation sub-layer by $0.5E+20/cm^3 \sim 1.5E+20/cm^3$.

In some embodiments, the first field passivation sub-layer includes an ion diffusion layer and an ion enrichment layer that are sequentially formed in a direction away from the substrate, and a doping concentration of the ion enrichment layer is greater than a doping concentration of the ion diffusion layer; the top surface of the second field passivation sub-layer is lower than the top surface of the first field passivation sub-layer, and a thickness difference between the second field passivation sub-layer and the first field passivation sub-layer is greater than a thickness of the ion enrichment layer in the direction away from the substrate toward the field passivation layer.

In some embodiments, the material of the first field passivation sub-layer is different from the material of the second field passivation sub-layer, and an absorption coefficient of the second field passivation sub-layer is smaller than an absorption coefficient of the first field passivation sub-layer.

In some embodiments, the material of the first field passivation sub-layer includes a polycrystalline silicon, the material of the second field passivation sub-layer includes an amorphous silicon.

In some embodiments, a thickness of the second field passivation sub-layer is different from a thickness of the first field passivation sub-layer by 50 nm~80 nm.

In some embodiments, the silver electrode includes one of a plurality of sub-gate lines or a main gate line connecting the plurality of sub-gate lines, and the conductive adhesive is configured to cover one or more of the main gate line and the plurality of sub-gate lines.

In some embodiments, when the conductive adhesive covers the main gate line, in a direction perpendicular to the extending direction of the main gate line, a width of the conductive adhesive is 1%~100% of a width of the silver electrode; in the extending direction of the main gate line, a length of the conductive adhesive is 50%~100% of a length of the main gate line.

In some embodiments, the electrode film is made of at least one of a conductive organic compound, a conductive inorganic compound, a non-silver metal or a non-silver metal composite.

In some embodiments, the conductive adhesive includes a base and a conductive particle, where the base is made of at least one of an acrylic acid, an epoxy, a silica gel, a maleic anhydride and a hybrid resin, and the conductive particle is made of at least one of a silver, a silver-coated copper, a gold, a nickel and a carbon.

Correspondingly, an embodiment of the present disclosure further provides a method for producing a solar cell, including: providing a substrate; sequentially forming a first passivation film, an anti-reflection layer and a first electrode that on a front surface of the substrate; and sequentially forming a tunneling layer, a field passivation layer and a second electrode on a rear surface of the substrate. The field passivation layer includes a first field passivation sub-layer corresponding to a portion of the field passivation layer in a first region formed between the at least one second electrode and the substrate and a second field passivation sub-layer corresponding to a portion of the field passivation layer in a second region formed between adjacent second electrodes; a conductivity of the first field passivation sub-layer is greater than a conductivity of the second field passivation sub-layer, and a thickness of the second field passivation sub-layer is smaller than a thickness of the first field passivation sub-layer; either the at least one first electrode or the at least one second electrode serves as a hybrid electrode including a silver electrode, a conductive adhesive and an electrode film that are sequentially disposed in a direction away from the substrate.

In some embodiments, the step of sequentially forming the tunneling layer, the field passivation layer and the at least one second electrode on the rear surface of the substrate sequentially includes: forming the tunneling layer and a first field passivation film on the rear surface of the substrate; sequentially forming an ion enrichment layer and an ion diffusion layer in the first field passivation film in a direction away from the substrate via an ion implantation process; the ion enrichment layer includes a first enrichment layer in the first region and a second enrichment layer in the second region; an average doping concentration of the first enrichment layer is identical to an average doping concentration of the second enrichment layer, and a surface doping concentration of a top surface of the first enrichment layer is identical to a surface doping concentration of a top surface of the second enrichment layer in a direction away from the substrate; forming a mask layer on the first field passivation film in the first region, and etching the enrichment layer in the second region, wherein the enrichment layer in the second region is not covered by the mask layer; removing the mask layer and forming a second passivation film covering a surface of the field passivation layer away from the substrate; and forming the at least one second electrode.

In some embodiments, the step of sequentially forming the tunneling layer, the field passivation layer and the at least one second electrode on the rear surface of the substrate sequentially includes: forming the tunneling layer and a first field passivation film on the rear surface of the substrate; sequentially forming an ion enrichment layer and an ion diffusion layer in the first field passivation film in a direction away from the substrate via an ion implantation process; the ion enrichment layer includes a first enrichment layer in the first region and a second enrichment layer in the second region; an average doping concentration of the first enrichment layer is greater than an average doping concentration of the second enrichment layer, and a surface doping concentration of the top surface of the first enrichment layer is greater than a surface doping concentration of the top surface of the second enrichment layer in the direction away from the substrate; forming a mask layer on the first field passivation film in the first region, and etching the enrichment layer in the second region, wherein the enrichment layer in the second region is not covered by the mask layer; removing the mask layer and forming a second passivation film covering a surface of the field passivation layer away from the substrate; and forming the at least one second electrode.

In some embodiments, the forming the mask layer on the first field passivation film in the first region includes: formed the mask layer by a screen printing process or an ink jet printing process; wherein the mask layer is made of an organic wax; and a thickness of the organic wax is 50 μm~300 μm.

In some embodiments, the etching the enrichment layer in the second region includes: controlling the enrichment layer in the second region by a reaction time, a reaction temperature and a solution ratio, wherein the solution ratio is set as $HF:HNO3:H2O=1:5:5~1:25:25$, the reaction temperature is 7° C.~15° C., and the reaction time is 30 s~90 s; the removing the mask layer includes: removing the mask layer with an alkaline solution with a concentration of 0.1~10%.

In some embodiments, the forming the at least one second electrode includes: printing a thin layer of a silver paste on a surface of the second passivation film away from the substrate by a screen printing process; drying and sintering the silver paste to form the silver electrode penetrating through the second passivation film and contacting the first field passivation sub-layer; forming the conductive adhesive on the silver electrode; forming the electrode film on the conductive adhesive; an adhesive connection between the silver electrode and the electrode film is realized by the conductive adhesive under a preset temperature and pressure condition.

In some embodiments, a thickness of the silver electrode is 1~5 μm, a thickness of the conductive adhesive is 1~5 μm, and a thickness of the electrode film is 5~20 μm.

Compared with the existing technology, the technical solution provided by the embodiments of the present disclosure has the following advantages:

In the above technical solution, the first field passivation sub-layer in contact with the second electrode has a relatively high conductivity, which is conducive to ensuring an effective transmission of majority carriers and improving a short-circuit current of the solar cell. Moreover, the thickness of the second field passivation sub-layer is smaller than the thickness of the first field passivation sub-layer, which is conductive to weakening a light absorption capability of the second field passivation sub-layer, thus improving the conversion efficiency of the solar cell. Besides, the electrode film bonded by the conductive adhesive may be any conductive material, that is, may be a material with a lower cost than the silver, which is conductive to reducing the cost of the solar cell.

In addition, by controlling a surface doping concentration of a surface of the second field passivation sub-layer away from the substrate to be relatively small, the light absorption capacity of the second field passivation sub-layer is weak; and by controlling a surface doping concentration of a surface of the first field passivation sub-layer away from the substrate to be relatively large, a good ohmic contact is ensured to be formed between the field passivation layer and the second electrode, thereby ensuring the effective transmission of the majority carriers.

BRIEF DESCRIPTION OF THE DRAWINGS

One or more embodiments are described as examples with reference to the corresponding figures in the accompanying drawings, and the examples do not constitute a limitation to the embodiments. Elements with the same reference numerals in the accompanying drawings represent similar elements. The figures in the accompanying drawings do not constitute a proportion limitation unless otherwise stated.

DETAILED DESCRIPTION OF THE EMBODIMENTS

The embodiments of the present disclosure will be described in detail below with reference to the accompanying drawings in order to make the objectives, technical solutions and advantages of the present disclosure clearer. However, those skilled in the art may appreciate that, in the various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

Figure 1:
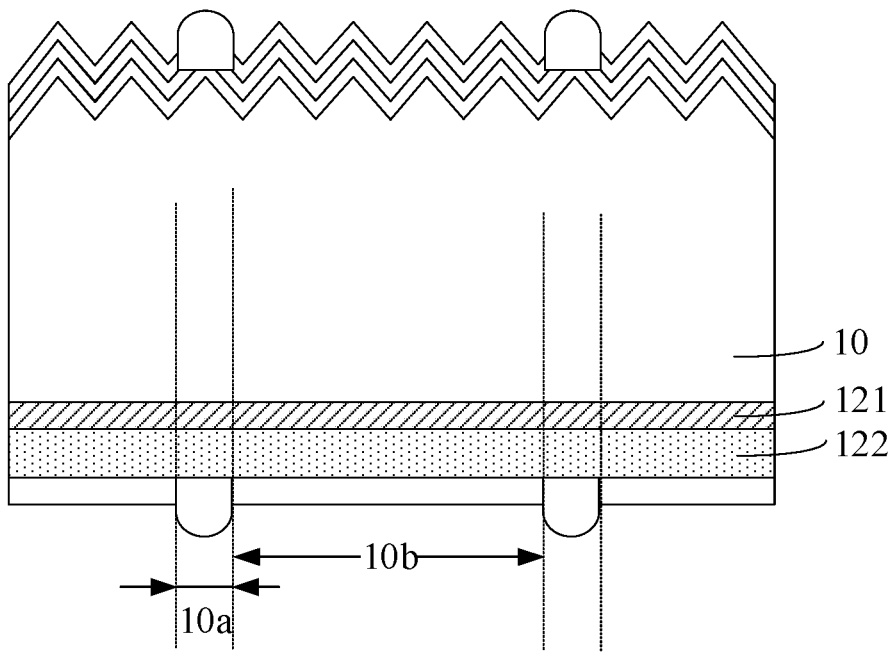
FIG. 1 is a schematic structural diagram of a solar cell.

Referring to FIG. 1, a TOPCon (Tunnel Oxide Passivating Contact) solar cell is taken as an example.

In existing applications, the solar cell may be divided into a first region 10*a* and a second region 10*b*. A field passivation layer 122 is uniformly deposited on a surface of a tunneling layer 121 as a film with the same material property and uniform thickness, and a field passivation layer in the first region 10*a* is in contact with a second electrode.

The field passivation layer 122 may be a doped polycrystalline silicon layer or a doped amorphous silicon layer. In order to achieve a lowest saturation recombination current density in the a covering region of the second electrode, i.e., the first region 10*a*, the field passivation layer 122 in the first region 10*a* needs to be heavily doped so as to form a relatively obvious band bending on a surface of a substrate 10, realize a field passivation for minority carriers, realize a selective transmission for majority carriers, form a good ohmic contact with the second electrode, and ensure an effective transmission of the majority carriers. However, the heavily doped field passivation layer 122 has a relatively strong light absorption capacity, which may correspondingly reduce a total amount of photons entering a body region of the solar cell, thus reducing a short-circuit current and conversion efficiency of the solar cell.

Therefore, a common passivated contact technology is generally applied to a rear surface, i.e., a back surface, of the solar cell to reduce an influence on the light absorption. However, since the field passivation layer 122 is generally the film with the same material property and the uniform thickness, its own light absorption is still serious, which is not conducive to the improvement of the conversion efficiency.

In addition, in order to save the costs of the first electrodes on the front surface and the second electrodes on the rear surface, the following technology adopted in the existing technology often have corresponding problems: first, a component of a silver paste is improved to reduce a silver content, but a proportion of a silver in the silver paste still exceeds 60%. Second, a screen pattern of a screen printing is optimized to reduce a silver paste consumption of a single cell without reducing the conversion efficiency, but a bottleneck of the existing screen printing technology limits an optimization of a height and a width of a metal electrode, especially in terms of the height. Too low the height may reduce the conversion efficiency, and too high the height may waste the silver paste. Third, when a chemical plating or electroplating technology is adopted, nickel, copper or silver electrode is used instead of the silver paste electrode. However, a tension between a plated electrode and a silicon wafer is not enough, and a chemical solution containing a metal atom needs to be adopted in the implementation process. A waste liquid treatment has a relatively high cost and is not environment-friendly. Besides, it is necessary to introduce a photolithography equipment or laser equipment, a chemical plating equipment or electroplating equipment to obtain an electrode pattern similar to that in the screen printing. Therefore, an equipment investment is huge.

In order to solve the above problems, embodiments of the present disclosure provide a solar cell and a method for producing the solar cell. A material of a first field passivation sub-layer in contact with the second electrode has a relatively high conductivity, which is conducive to ensuring the effective transmission of the majority carriers and improving the short-circuit current of the solar cell. Moreover, a thickness of a second field passivation sub-layer is smaller than a thickness of the first field passivation sub-layer, which is conductive to weakening a light absorption capability of the second field passivation sub-layer, thus improving the conversion efficiency of the solar cell. Besides, an electrode film bonded by a conductive adhesive may be any conductive material, that is, may be a material with a lower cost than the silver, which is conductive to reducing the cost of the solar cell.

Figure 2:
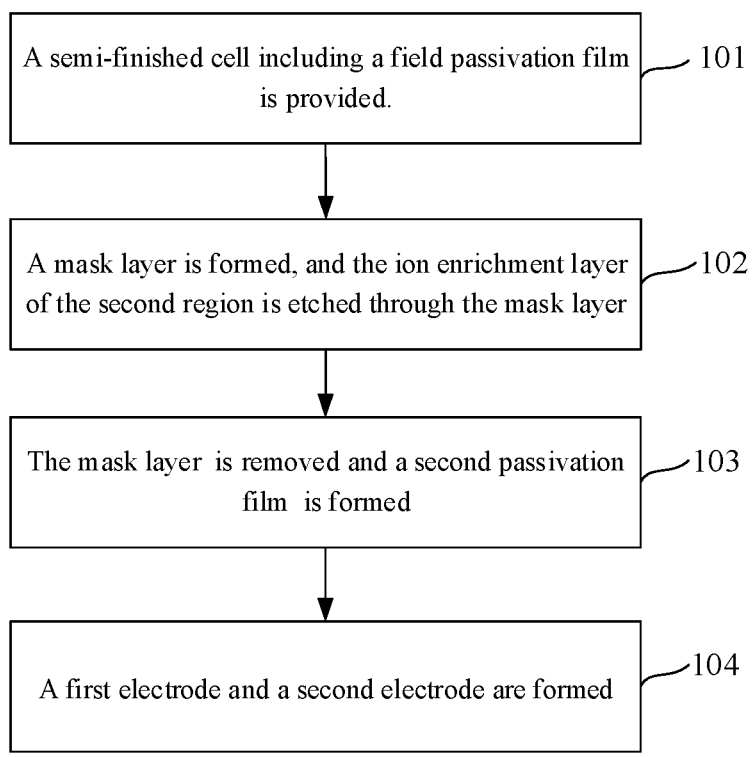
FIG. 2 is a schematic flow chart of a method for producing a solar cell according to an embodiment of the present disclosure.
Figure 4:
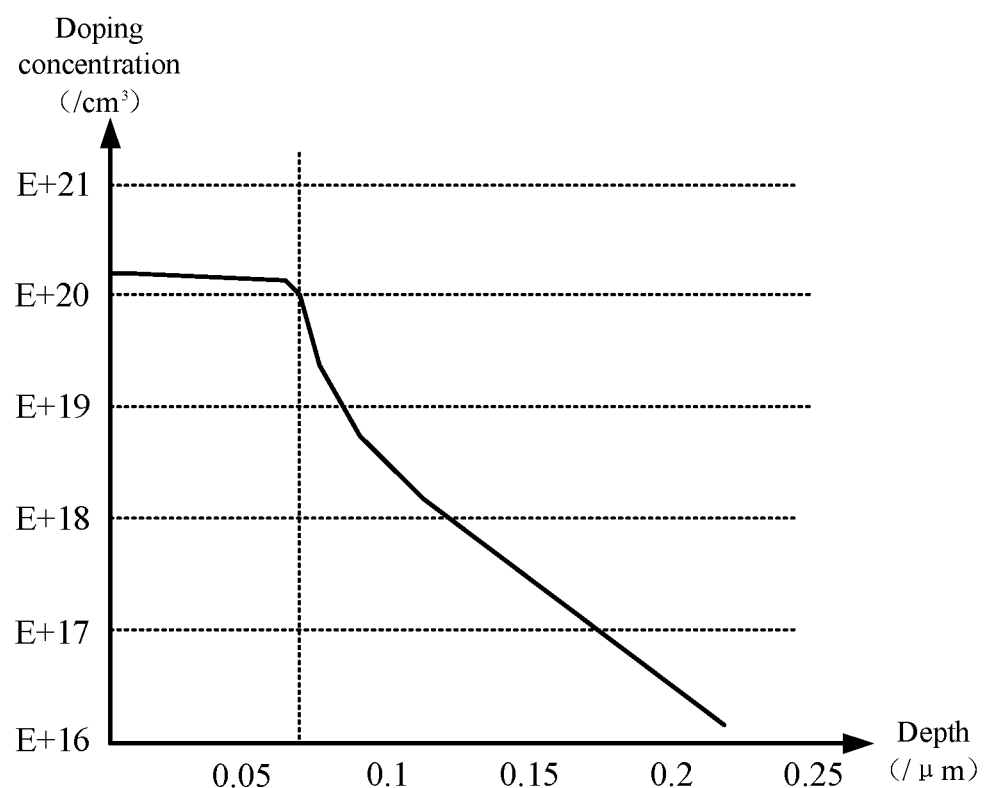
FIGS. 4 and 5 are schematic diagrams of a depth-doping concentration of a field passivation film in the structure shown in FIG. 3.
Figure 5:
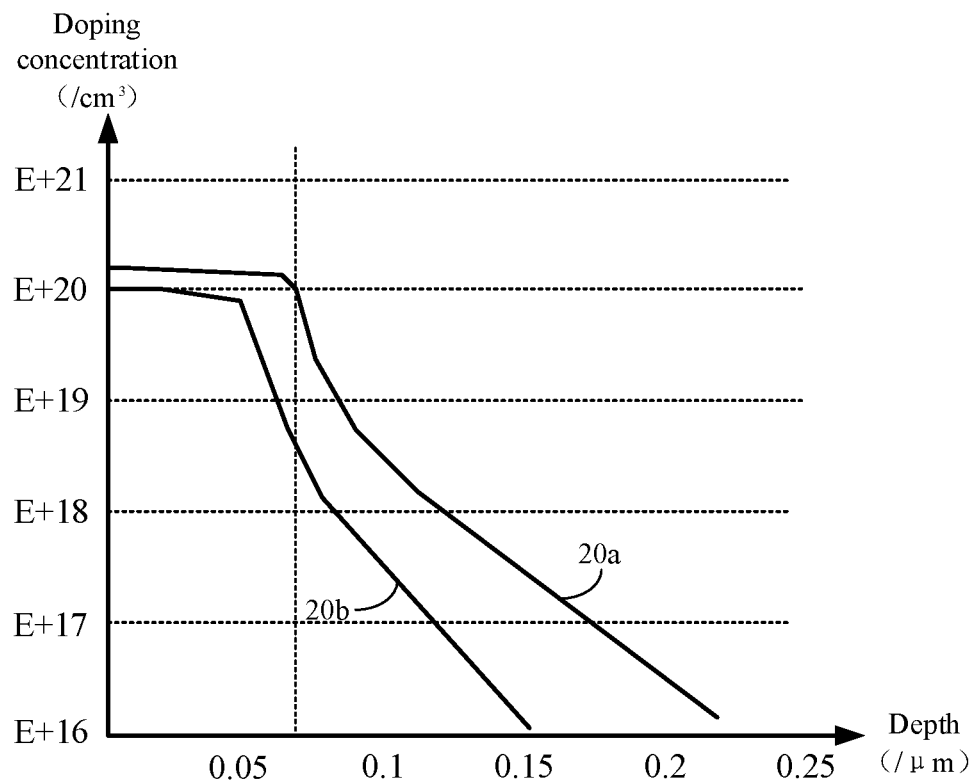

FIG. 2 is a schematic flow chart of a method for producing a solar cell according to an embodiment of the present disclosure. FIGS. 3, 6 to 8 are schematic structural diagrams corresponding to each step of the method for producing the solar cell according to the embodiment of the present disclosure. FIGS. 4 and 5 are schematic diagrams of a depth-doping concentration of a field passivation film in the structure shown in FIG. 3. Referring to FIGS. 2 to 8, the method for producing the solar cell includes the following steps.

Figure 3:
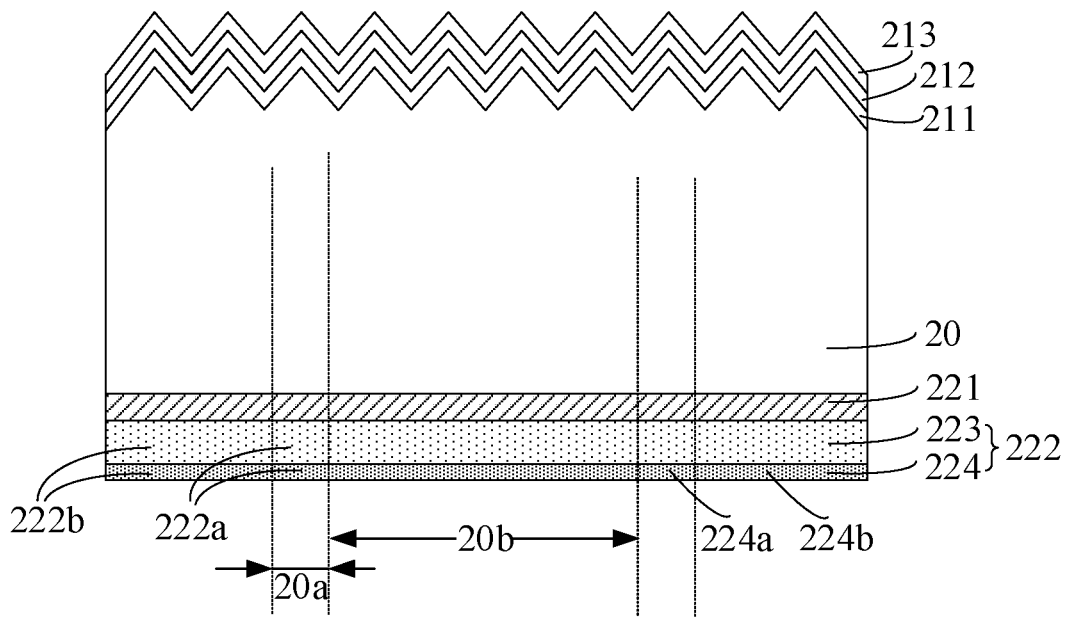
FIGS. 3, 6 to 8 are schematic structural diagrams corresponding to each step of a method for producing a solar cell according to the embodiment of the present disclosure.

In step 101, referring to FIG. 3, a semi-finished cell including a field passivation film 222 is provided.

The semi-finished cell at least includes a substrate 20, an emitter 211 formed at a front surface of the substrate 20, a tunneling layer 221 and the field passivation film 222 sequentially formed on a rear surface of the substrate 20. In some embodiments, the semi-finished cell further includes a first passivation film 212 (also referred to as a front passivation film 212) and an anti-reflection layer 213 sequentially formed on a surface of the emitter 211. Herein, the emitter 211 is a doped layer diffused to a certain depth from a surface of the substrate 20, thus a PN junction structure is formed in the substrate 20.

Herein, a material of the substrate 20 includes a silicon material, and the solar cell is divided to a first region 20*a* and a second region 20*b*. A material of the tunnel layer 221 includes a silicon oxide with a thickness of 1~2 nm, which may be formed by a thermal oxidation process. A material of the field passivation film 222 includes a doped polycrystalline silicon, and the field passivation film 222 of the first region 20*a* is used for contact connection with a second electrode formed subsequently.

In this embodiment, the field passivation film 222 includes an ion diffusion layer 223 and an ion enrichment layer 224 that are sequentially formed in a direction away from the substrate 20. A doped ion concentration of the ion enrichment layer 224 is greater than a doped ion concentration of the ion diffusion layer 223. The ion enrichment layer 224 may be obtained by an ion implantation of an intrinsic semiconductor via an ion implantation process, and a doped ion in the ion diffusion layer 223 may be obtained by a free diffusion and migration of the doped ion in ion enrichment layer 224 due to a concentration difference. The ion enrichment layer 224 is used to ensure that a good ohmic contact may be formed between the field passivation film 222 and the second electrode, thereby ensuring an effective transmission of carriers. Besides, it is also used to form an obvious band bending and realize a selective transmission of the carriers. The ion diffusion layer 223 is used to ensure an effective transmission of majority carriers.

In this embodiment, a material of the ion enrichment layer 224 is the same as a material of the ion diffusion layer 223, which is conductive to reducing an interfacial energy between the ion enrichment layer 224 and the ion diffusion layer 223, increasing the number of the doped ions diffused into the ion diffusion layer 223, and ensuring that the field passivation film 222 has a relatively high conductivity on a transmission path of the majority carriers, thereby ensuring the effective transmission of the majority carriers and improving the conversion efficiency of the solar cell. In other embodiments, the material of the ion enrichment layer is different from the material of the ion diffusion layer, which is conductive to reducing the diffusion of the doped ions because of a limitation of the interfacial energy, thus ensuring that the ion enrichment layer has a relatively high doping concentration, and further ensuring that the good ohmic contact may be formed between the field passivation film and the second electrode.

Specifically, the material type of the field passivation film 222 includes at least one of the intrinsic semiconductor, a metal oxide, a silicide, a salt, an organic compound or a metal. Specifically, the intrinsic semiconductor includes a polysilicon, an amorphous silicon or a microcrystalline silicon. The metal oxide includes TiOx, MoOx, Vox, Wox or MgOx, the silicide includes SiC, SiNx, SiOxNy or SiOxNyCz. The salt includes MgFx, CsFx or LiFx. The organic compound includes Poly(3,4-ethylenedioxythiophene)-poly styrenesulfonate (PEDOT/PSS), and the metal includes Mg, Ca or Al. It should be noted that the selection of the metal is related to the doping type and the doping concentration of the substrate 20, that is, the field passivation film 222 may match a corresponding work function according to the doping type and the doping concentration of the substrate 20.

According to a region division of the solar cell, the field passivation film 222 may include a first field passivation film 222a disposed at the first region 20a and a second field passivation film 222b disposed at the second region 20b, and the ion enrichment layer 224 may include a first enrichment layer 224a disposed at the first region 20a and a second enrichment layer 224b disposed at the second region 20b.

In this embodiment, the first enrichment layer 224a and the second enrichment layer 224b are simultaneously formed by the same ion implantation process. That is, an average doping concentration of the first enrichment layer 224a is identical to an average doping concentration of the second enrichment layer 224b, and a surface doping concentration of a top surface of the first enrichment layer 224a is identical to a surface doping concentration of a top surface of the second enrichment layer 224b in a direction away from the substrate 20 toward the field passivation film 222.

FIG. 4 illustrates that the doping concentrations of the field passivation film 222 at different depths in a direction toward the substrate 20. According to the depth-doping concentration diagram shown in FIG. 4, in a direction perpendicular to the surface of the substrate 20, a thickness of the ion enrichment layer 224 is about 70 nm, a surface doping concentration of a surface of the ion enrichment layer 224 away from the substrate 20 is greater than 1.5E+20/cm$^3$, and a doping concentration of the ion diffusion layer 223 is less than or equal to 1.5E+20/cm$^3$.

In another embodiment, the first enrichment layer 224a and the second enrichment layer 224b are formed by different ion implantation processes respectively. The average doping concentration of the first enrichment layer 224a is greater than the average doping concentration of the second enrichment layer 224b, and the surface doping concentration of the top surface of the first enrichment layer 224a is greater than the surface doping concentration of the top surface of the second enrichment layer 224b in the direction away from the substrate 20 toward the field passivation film 222. In this way, it is conductive to weakening a light absorption capability of the second field passivation film 222b and improving the conversion efficiency of the solar cell.

FIG. 5 illustrates that the doping concentrations of the field passivation film 222 at different depths in the direction toward the substrate 20 in another embodiment. According to the depth-doping concentration diagram shown in FIG. 5, in the direction perpendicular to the surface of the substrate 20, the surface doping concentration of the top surface of the first enrichment layer 224a is greater than 1.5E+20/cm$^3$, and the surface doping concentration of the top surface of the second enrichment layer 224b is less than 1.5E+20/cm$^3$.

It should be noted that the light absorption capacity is related to the thickness and the doping concentration of the field passivation film 222. The doping concentration includes the surface doping concentration of the surface of the field passivation film 222 away from the substrate 20 and the average doping concentration of the field passivation film 222. Specifically, the absorption capacity may be calculated according to a formula $I=I_0\exp(-a*d)$, where I denotes a residual intensity of an incident light after passing through a light absorption medium, $I_0$ denotes an intensity of an incident light, a denotes an absorption coefficient of the field passivation film 222, and d denotes the thickness of the field passivation film 222. A value of a is related to the surface doping concentration or the average doping concentration of the field passivation film 222. The higher the surface doping concentration or average doping concentration, the greater the value of a.

According to the above descriptions, reducing the surface doping concentration of the surface of the field passivation film 222 away from the substrate 20, reducing the average doping concentration of the field passivation film 222 or thinning the thickness of the field passivation film 222 may facilitate to reduce the light absorption capacity of the field passivation film 222, and improve the residual intensity of the incident light after passing through the light absorption medium, that is, an intensity of a light reaching the surface of the substrate 20, thus increasing the light available for the solar cell. Besides, since the light absorption capacity of the field passivation film 222 is reduced, a second passivation film formed subsequently may reflect a light transmitted from the substrate 20 back to the surface of the substrate 20, thereby further increasing the light available for the solar cell.

Figure 6:
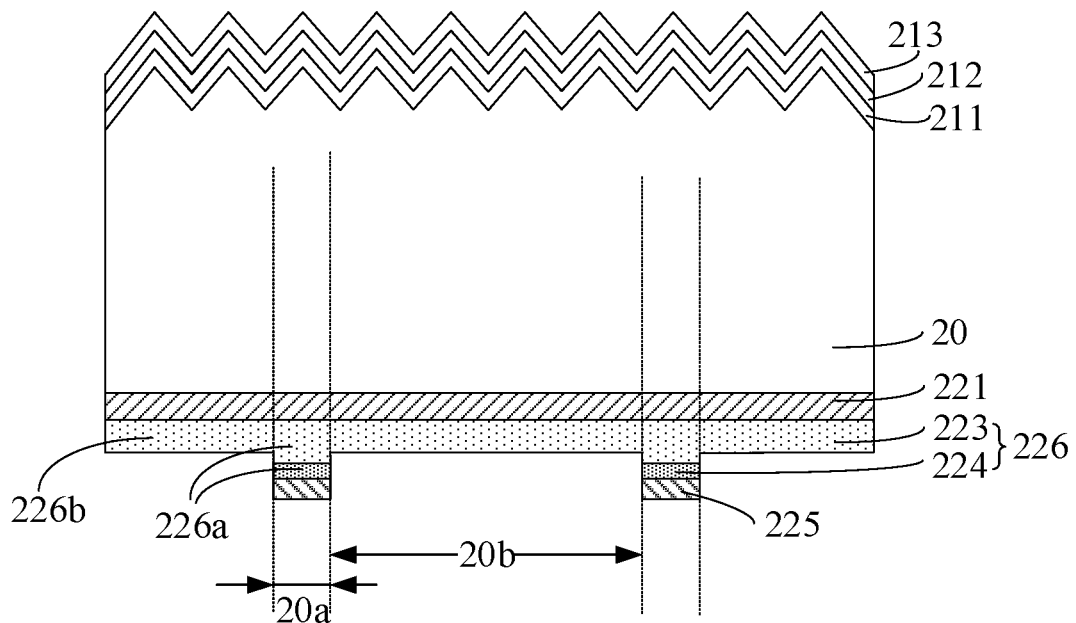

In step 102, referring to FIG. 6, a mask layer 225 is formed, and the ion enrichment layer 224 of the second region 20b is etched due to not being covered by the mask layer 225.

In this embodiment, the mask layer 225 covers the first field passivation film 222a (refer to FIG. 3), and the mask layer 225 is made of an organic wax. A thickness of the organic wax is 50 μm-300 μm in the direction perpendicular to the surface of the substrate 20. A view of the mask layer 225 is a finger grid line in a direction of the mask layer 225 toward the substrate 20. The mask layer 225 may be formed by a screen printing process or an ink jet printing process.

After forming the mask layer 225, the semi-finished cell may be placed in a mixed solution of a nitric acid, a hydrofluoric acid and water for reaction. Since the organic wax does not react with the mixed solution, the first field passivation film 222a protected by the mask layer 225 may not be etched by the mixed solution, while the second field passivation film 222b (refer to FIG. 3) exposed out of the mask layer 225 may be etched, thus the thickness of the second field passivation film 222b is reduced while the thickness of the first field passivation film 222a is not reduced. As a result, the second field passivation film 222b is different in thickness from the first field passivation film 222a. The first field passivation film 222a serves as a first field passivation sub-layer 226a, and the remaining second field passivation film 222b serves as a second field passivation sub-layer 226b. The first field passivation sub-layer 226a and the second field passivation sub-layer 226b together constitute a field passivation layer 226.

In this embodiment, the thickness difference may be controlled by controlling a reaction time, a reaction temperature and a solution ratio etc. Specifically, when the thickness difference needs to be controlled to be 0 μm~100 μm, the solution ratio may be set as HF:HNO3:H2O=1:5:5~1:25:25, the reaction temperature is 7° C.~15° C., and the reaction time is 30 s~90 s.

After being etched, a thickness of the second field passivation sub-layer 226b is smaller than a thickness of the first field passivation sub-layer 226a in the direction perpendicular to the surface of the substrate 20. Since a surface of the first field passivation sub-layer 226a toward the substrate 20 is flush with a surface of the second field passivation sub-layer 226b toward the substrate 20, a top surface of the second field passivation sub-layer 226b is lower than a top surface of the first field passivation sub-layer 226a in a direction away from the substrate 20 toward the field passivation layer 226.

In this embodiment, an etching depth is greater than the thickness of the ion enrichment layer 224, that is, a surface of the second field passivation sub-layer 226b away from the substrate 20 is located within the ion diffusion layer 223, and a surface doping concentration of the surface of the second field passivation sub-layer 226b away from the substrate 20 is smaller than a surface doping concentration of a surface of the first field passivation sub-layer 226a away from the substrate 20. In this way, it is conductive to weakening a light absorption capability of the second field passivation sub-layer 226b, and improving the conversion efficiency of the solar cell.

In this embodiment, the thickness difference between the second field passivation sub-layer 226b and the first field passivation sub-layer 226a is 50 nm~80 nm. A concentration difference between the surface doping concentration of the surface of the second field passivation sub-layer 226b away from the substrate 20 and the surface doping concentration of the surface of the first field passivation sub-layer 226a away from the substrate 20 is $0.5E+20/cm^3 \sim 1.5E+20/cm^3$.

Specifically, in the direction perpendicular to the surface of the substrate 20, the thickness of the first field passivation sub-layer 226a is 120 nm, and the surface doping concentration of the surface of the first field passivation sub-layer 226a away from the surface of the substrate 20 is $2E+20/cm^3$; the thickness of the second field passivation sub-layer 226b is 50 nm, and the surface doping concentration of the surface of the second field passivation sub-layer 226b away from the surface of the substrate 20 is $E+20/cm^3$.

Since the thickness of the first field passivation sub-layer 226a and the surface doping concentration of the surface of the first field passivation sub-layer 226a away from the substrate 20 are not changed, the first field passivation sub-layer 226a still has a good passivation effect. Besides, since an average doping concentration of the first field passivation sub-layer 226a is greater than an average doping concentration of the second field passivation sub-layer 226b, a conductivity of a material of the first field passivation sub-layer 226a is greater than a conductivity of a material of the second field passivation sub-layer 226b, and there may still be a relatively large short-circuit current between the first field passivation sub-layer 226a and the second electrode formed subsequently. In other words, by thinning the second field passivation sub-layer 226b, the conversion efficiency of the solar cell may be improved while maintaining an open circuit voltage of the solar cell.

Since the higher the conductivity, the smaller the resistivity, the material of the first field passivation sub-layer 226a is controlled to have a relatively high conductivity, which is conductive to reducing a flow loss of the carriers and improving the conversion efficiency of the solar cell.

In other embodiments, the etching depth is less than or equal to the thickness of the ion enrichment layer, which is conductive to weakening the light absorption capacity of the second field passivation film while ensuring that the surface doping concentration of the surface of the second field passivation film away from the substrate is similar to or the same as the surface doping concentration of the surface of the first field passivation film away from the substrate, that is, ensuring that there is a relatively high potential barrier between the substrate and the surface of the second field passivation film away from the substrate, thus maintaining the field passivation effect of the second field passivation film and making any position on the surface of the substrate have a relatively strong selective transmission capability for the carriers.

Figure 7:
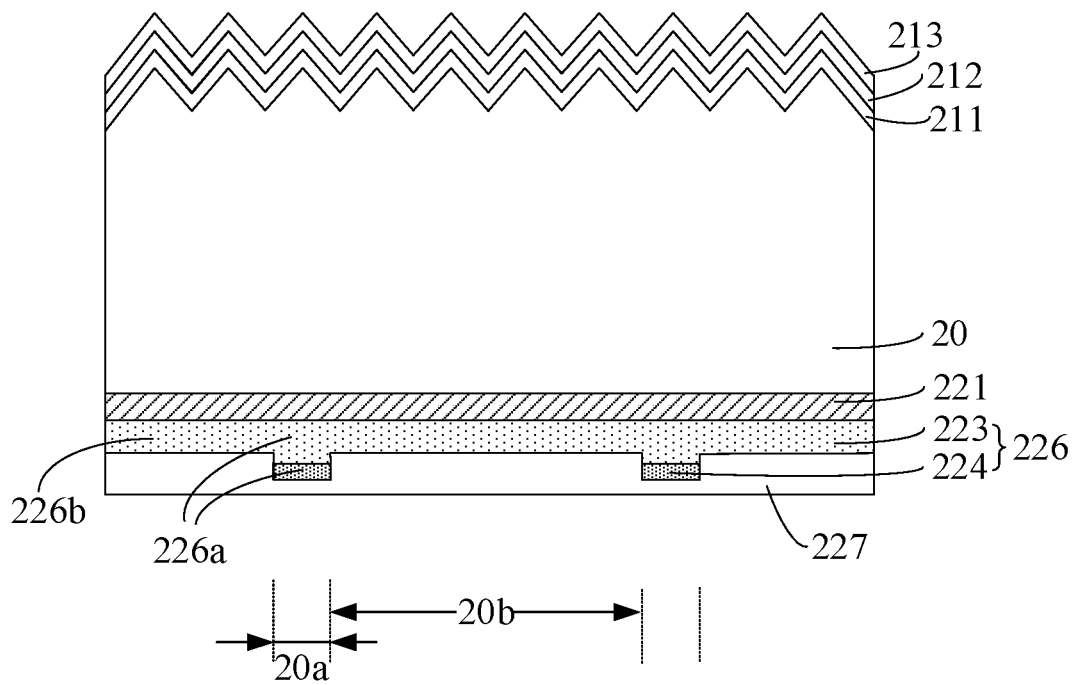

In step 103, referring to FIG. 7, the mask layer 225 (shown in FIG. 6) is removed and the second passivation film 227 is formed.

In this embodiment, after etching the ion enrichment layer 224 of the second region 20b, the semi-finished cell is cleaned with an alkaline solution with a concentration of 0.1~10% to remove the mask layer 225, thereby exposing the ion enrichment layer 224 with a finger grid line pattern on the top surface. The second passivation film 227 is deposited to cover the surface of the field passivation layer 226 away from the substrate 20. The second passivation film 227 contains a hydrogen ion, and the diffused hydrogen ion may passivate a surface defect, a bulk defect of the substrate 20 and an interface defect between the substrate 20 and the tunneling layer 221 during a high temperature treatment. Herein, the alkaline solution includes a diluted potassium hydroxide solution.

Figure 8:
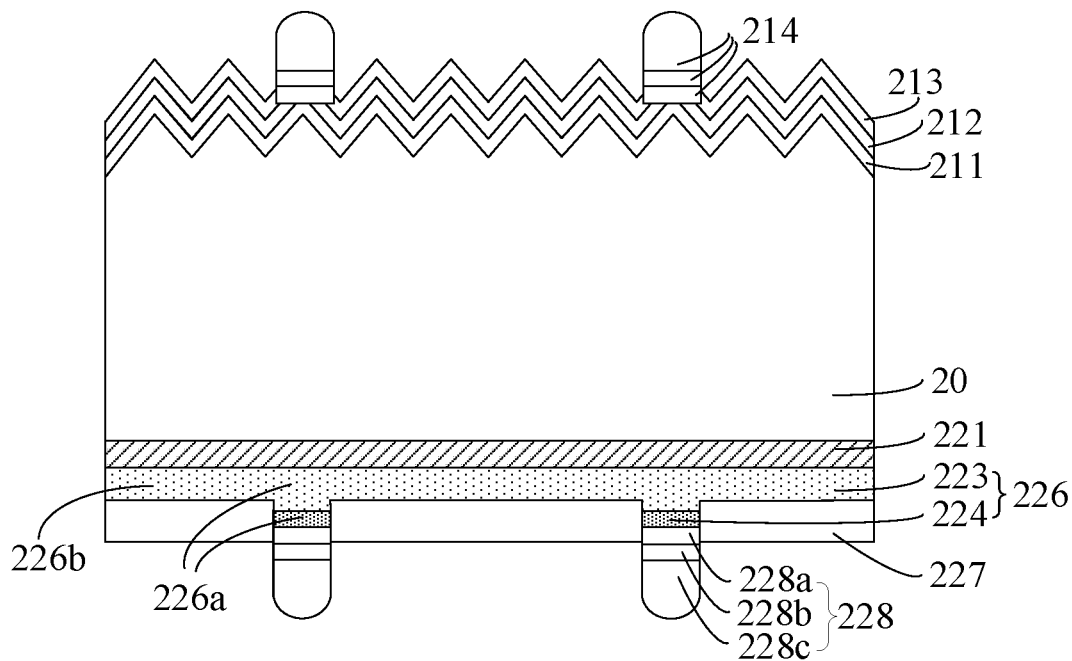

In step 104, referring to FIG. 8, at least one first electrode 214 (also referred to as a front electrode 214) and at least one second electrode 228 (also referred to as a back electrode 228) are formed.

In this embodiment, either the at least one first electrode 214 or the at least one second electrode 218 serves as a hybrid electrode including a silver electrode, a conductive adhesive and an electrode film sequentially disposed in a direction away from the substrate. In the direction away from the substrate 20 toward the field passivation layer 226, the second electrode 228 includes a silver electrode 228a, a conductive adhesive 228b, and an electrode film 228c that are sequentially disposed. In the direction away from the substrate 20 toward the first passivation film 212, the first electrode 214 has the same stacked structure as the second electrode 228. In other embodiments, a structure of the first electrode is different from a structure of the second electrode. The process steps for forming the second electrode 228 are specifically as below.

A thin layer of a silver paste is printed on a surface of the second passivation film 227 away from the substrate 20 by a screen printing process, and the silver paste is dried and sintered to form the silver electrode 228a that penetrates through the second passivation film 227 and contacts the first field passivation sub-layer 226a. The conductive adhesive 228b is laid on the silver electrode 228a. The electrode film 228c is laid on a surface of the conductive adhesive 228b. At last, an adhesive connection between the silver electrode 228a and the electrode film 228c is realized by the conductive adhesive 228b under a preset temperature and pressure condition.

The silver electrode 228a is prepared by printing and sintering the silver paste, which is mainly to ensure that a good tensile force may be formed between the second electrode 228 and the field passivation layer 226. Herein, the silver electrode 228a includes one of a plurality of sub-gate lines or a main gate line connecting the plurality of sub-gate lines. An extending direction of the main gate line is generally perpendicular to an extending direction of the sub-gate lines, and the main gate line is used for a connection between the solar cells in the subsequent preparing process of a module.

The conductive adhesive 228b may cover the main gate line or a plurality of sub-gate lines. Taking the main gate line as an example, when the conductive adhesive 228b covers the main gate line, in a direction perpendicular to the extending direction of the main gate line, a width of the conductive adhesive 228b is 1%~100% of a width of the silver electrode 228a. The conductive adhesive 228b may be a continuous coverage or a discontinuous coverage, preferably with a width ratio of 100% and the continuous coverage. In the extending direction of the main gate line, a length of the conductive adhesive 228b is 50%~100% of a length of the main gate line. The conductive adhesive 228b may be the continuous coverage or the discontinuous coverage, preferably with a length ratio of 100% and the continuous coverage.

The conductive adhesive 228b is an adhesive with a certain conductive property after curing or drying, which includes a base and conductive particles. The base has a bonding effect to bond the conductive particles together to form a conductive path and realize a conductive connection of bonded materials. Herein, the base is made of an acrylic acid, an epoxy, a silica gel, a maleic anhydride or a hybrid resin, and the conductive particles are made of a silver, a silver-coated copper, a gold, a nickel or a carbon.

The electrode film 228c may be fully or partially disposed on the conductive adhesive 228b. The electrode film 228c can be made of a conductive organic compound, a conductive inorganic compound, a non-silver metal, a non-silver metal composite, or the like, or any combination thereof. The conductive inorganic compound includes a carbon. The non-silver metal includes a gold, a nickel, a copper, a tin, an aluminum, etc. In the direction perpendicular to the surface of the substrate 20, a height of the electrode film 228c may be adjusted according to actual needs in order to increase a cross-sectional area of a current transmission, reduce a transmission resistance of the second electrode 228, and improve the conversion efficiency of the solar cell.

Since the material of the bonded electrode film 228c is not limited, a material with a relatively low cost may be selected to reduce a producing cost of the solar cell.

In this embodiment, the first field passivation sub-layer in contact with the second electrode has a relatively high conductivity, which is conducive to ensuring the effective transmission of the majority carriers and improving the short-circuit current of the solar cell. Moreover, the thickness of the second field passivation sub-layer is smaller than the thickness of the first field passivation sub-layer, which is conductive to weakening the light absorption capability of the second field passivation sub-layer, thus improving the conversion efficiency of the solar cell. Besides, the electrode film bonded by the conductive adhesive may be any conductive material, that is, may be a material with the lower cost than the silver, which is conductive to reducing the cost of the solar cell.

Correspondingly, an embodiment of the present disclosure further provides a solar cell which may be produced by the above-described method for producing the solar cell.

Referring to FIG. 8, the solar cell includes: a substrate 20; a first passivation film 212, an anti-reflection layer 213 and a first electrode 214 sequentially disposed on a front surface of the substrate 20; and a tunneling layer 221, a field passivation layer 226 and a second electrode 228 sequentially disposed on a rear surface of the substrate 20. The field passivation layer 226 includes a first field passivation sub-layer 226a corresponding to a portion of the field passivation layer 226 between the second electrode 228 and the substrate 20 and a second field passivation sub-layer 226b corresponding to a portion of the field passivation layer 226 between adjacent second electrodes 228. A conductivity of the first field passivation sub-layer 226a is greater than a conductivity of the second field passivation sub-layer 226b, and a thickness of the second field passivation sub-layer 226b is smaller than a thickness of the first field passivation sub-layer 226a in a direction perpendicular to a surface of the substrate 20. In a direction away from the substrate 20 toward the first passivation film 212, the first electrode 214 includes a silver electrode, a conductive adhesive, and an electrode film that are sequentially formed; and/or, in a direction away from the substrate 20 toward the field passivation layer 226, the second electrode 228 includes a silver electrode 228a, a conductive adhesive 228b, and an electrode film 228c that are sequentially disposed.

In this embodiment, a bottom surface of the second field passivation sub-layer 226b is flush with a bottom surface of the first field passivation sub-layer 226a in the direction away from the substrate 20 toward the field passivation layer 226. In addition, a thickness difference between the second field passivation sub-layer 226b and the first field passivation sub-layer 226a is 50 nm~80 nm, for example, 60 nm, 65 nm or 70 nm.

Figure 9:
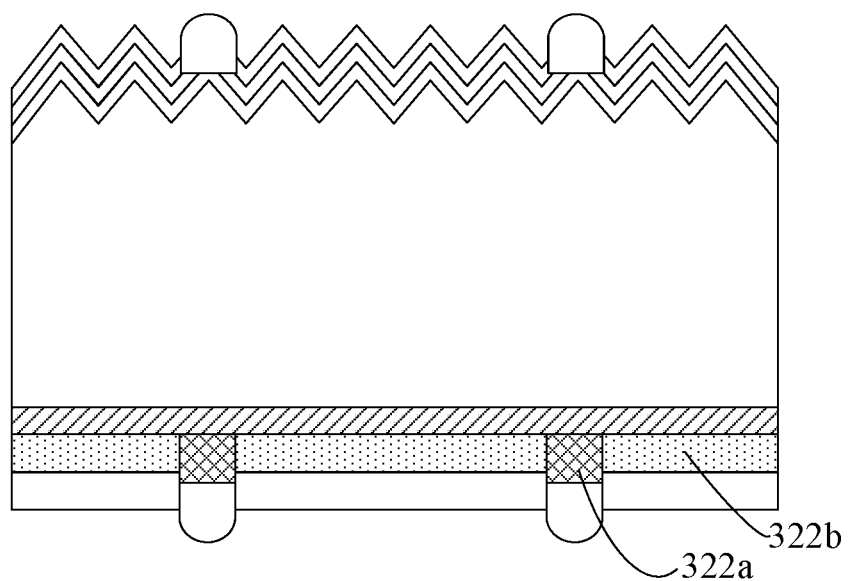
FIG. 9 is a schematic structural diagram of a solar cell according to another embodiment of the present disclosure.

In other embodiments, referring to FIG. 9, a material of the first field passivation sub-layer 322a is different from a material of the second field passivation sub-layer 322b. Specifically, an absorption coefficient of the material of the second field passivation sub-layer 322b is smaller than an absorption coefficient of the material of the first field passivation sub-layer 322a.

For example, the material of the first field passivation sub-layer 322a is a polycrystalline silicon, and the material of the second field passivation sub-layer 322b is an amorphous silicon. Since a passivated contact structure is adopted for a back surface of the solar cell, and a sunlight is mainly in a long-wave spectrum after reaching the back surface, using the amorphous silicon with a relatively low absorption coefficient in the long-wave spectrum as the material of the second field passivation sub-layer 322b may reduce an absorption in the long-wave spectrum and improve a conversion efficiency of the solar cell.

In this embodiment, in the direction away from the substrate 20 toward the field passivation layer 226, a surface doping concentration of a top surface of the second field passivation sub-layer 226b is lower than a surface doping concentration of a top surface of the first field passivation sub-layer 226a. Specifically, a surface doping concentration difference between the top surface of the first field passivation sub-layer 226a and the top surface of the second field passivation sub-layer 226b is $0.5E+20/cm^3 \sim 1.5E+20/cm^3$, for example, $0.75 E+20/cm^3$, $1 E+20/cm^3$ or $1.25 E+20/cm^3$.

In this embodiment, in the direction away from the substrate 20, the first field passivation sub-layer 226a includes an ion diffusion layer 223 and an ion enrichment layer 224 that are sequentially formed, and a doping concentration of the ion enrichment layer 224 is greater than a doping concentration of the ion diffusion layer 223. In the direction away from the substrate 20 toward the field passivation layer 226, the top surface of the second field passivation sub-layer 226b is lower than the top surface of the first field passivation sub-layer 226a, and a thickness difference between the second field passivation sub-layer 226b and the first field passivation sub-layer 226a is greater than a thickness of the ion enrichment layer 224.

In this embodiment, the silver electrode 228a includes a plurality of sub-gate lines or a main gate line connecting the plurality of sub-gate lines. The conductive adhesive 228b covers one or more of the main gate line and the plurality of sub-gate lines.

The electrode film 228c is made of a conductive organic compound, a conductive inorganic compound, a non-silver metal or a non-silver metal composite, and the non-silver metal includes a gold, a nickel, a copper, a tin or an aluminum, etc. The conductive adhesive 228b includes a base and conductive particles. The base is made of an acrylic acid, an epoxy, a silica gel, a maleic anhydride or a hybrid resin, and the conductive particles are made of a silver, a silver-coated copper, a gold, a nickel or a carbon.

Herein, in the direction perpendicular to the surface of the substrate 20, a thickness of the silver electrode 228a may be 1~5 μm, a thickness of the first passivation film 212 and a second passivation film 227 may be 0~100 nm, a thickness of the conductive adhesive 228b may be 1~5 μm, and a thickness of the electrode film 228c may be 5~20 μm.

In this embodiment, the first field passivation sub-layer in contact with the second electrode has a relatively high conductivity, which is conducive to ensuring an effective transmission of majority carriers and improving a short-circuit current of the solar cell. Moreover, the thickness of the second field passivation sub-layer is smaller than the thickness of the first field passivation sub-layer, which is conductive to weakening a light absorption capability of the second field passivation sub-layer, thus improving the conversion efficiency of the solar cell. Besides, the electrode film bonded by the conductive adhesive may be any conductive material, that is, may be a material with a lower cost than the silver, which is conductive to reducing the cost of the solar cell.

Those skilled in the art should appreciate that the aforementioned embodiments are specific embodiments for implementing the present disclosure. In practice, however, various changes may be made in the forms and details of the specific embodiments without departing from the spirit and scope of the present disclosure. Any person skilled in the art may make their own changes and modifications without departing from the spirit and scope of the present disclosure, so the protection scope of the present disclosure shall be subject to the scope defined by the claims.

What is claimed is:

1. A solar cell, comprising:
    a substrate;
    a first passivation film, an anti-reflection layer and at least one first electrode sequentially formed on a front surface of the substrate; and
    a tunneling layer, a field passivation layer and at least one second electrode sequentially formed on a rear surface of the substrate; wherein:
    the field passivation layer includes a first field passivation sub-layer corresponding to a portion of the field passivation layer in a first region between the at least one second electrode and the substrate, and a second field passivation sub-layer corresponding to a portion of the field passivation layer in a second region between adjacent second electrodes;
    a conductivity of the first field passivation sub-layer is greater than a conductivity of the second field passivation sub-layer, and a thickness of the second field passivation sub-layer is smaller than a thickness of the first field passivation sub-layer;
    a surface doping concentration of a top surface of the second field passivation sub-layer facing away from the substrate is lower than a surface doping concentration of a top surface of the first field passivation sub-layer facing away from the substrate;
    each of the first field passivation sub-layer and the second field passivation sub-layer includes an ion diffusion layer, the first field passivation sub-layer further includes an ion enrichment layer disposed on a surface of the ion diffusion layer of the first field passivation sub-layer facing away from the substrate, both the ion diffusion layer and the ion enrichment layer of the first field passivation sub-layer are doped with ions, and a doping concentration of the ion enrichment layer is greater than a doping concentration of the ion diffusion layer of the first field passivation sub-layer; and
    the top surface of the second field passivation sub-layer is closer to the substrate than the top surface of the first field passivation sub-layer, and a thickness of the ion diffusion layer of the first field passivation sub-layer is greater than a thickness of the ion diffusion layer of the second field passivation sub-layer in the direction away from the substrate toward the field passivation layer.

2. The solar cell according to claim 1, wherein either the at least one first electrode or the at least one second electrode serves as a hybrid electrode including a silver electrode, a conductive adhesive and an electrode film sequentially disposed in a direction away from the substrate.

3. The solar cell according to claim 1, wherein a bottom surface of the second field passivation sub-layer is flush with a bottom surface of the first field passivation sub-layer in the direction away from the substrate toward the field passivation layer.

4. The solar cell according to claim 1, wherein a top surface doping concentration of the first field passivation sub-layer is different from a top surface doping concentration of the second field passivation sub-layer by $0.5E+20/cm^3 \sim 1.5E+20/cm^3$.

5. The solar cell according to claim 1, wherein a material of the first field passivation sub-layer is different from a material of the second field passivation sub-layer, and an absorption coefficient of the material of the second field passivation sub-layer is smaller than an absorption coefficient of the material of the first field passivation sub-layer.

6. The solar cell according to claim 5, wherein the material of the first field passivation sub-layer includes a polycrystalline silicon, the material of the second field passivation sub-layer includes an amorphous silicon.

7. The solar cell according to claim 1, wherein a thickness of the second field passivation sub-layer is different from a thickness of the first field passivation sub-layer by 50 nm-80 nm.

8. The solar cell according to claim 2, wherein the electrode film is made of at least one of a conductive organic compound, a conductive inorganic compound, a non-silver metal and a non-silver metal composite.

9. The solar cell according to claim 8, wherein the conductive adhesive includes a base and a conductive particle, wherein the base is made of at least one of an acrylic acid, an epoxy, a silica gel, a maleic anhydride and a hybrid resin, and the conductive particle is made of at least one of a silver, a silver-coated copper, a gold, a nickel and a carbon.

* * * * *